United States Patent [19]

Gross

[11] Patent Number: 4,523,166

[45] Date of Patent: Jun. 11, 1985

[54] OPTIMAL FIELD INHOMOGENEITY CORRECTION COIL OPERATION FOR NMR MAGNETS

[75] Inventor: Dan A. Gross, Schenectady, N.Y.

[73] Assignee: General Electric Company, Schenectady, N.Y.

[21] Appl. No.: 662,744

[22] Filed: Oct. 19, 1984

[51] Int. Cl.³ .............................................. H01F 7/22
[52] U.S. Cl. .................................... 335/216; 324/320; 361/141
[58] Field of Search ....................... 335/216, 213, 299; 324/318, 319, 320, 322; 361/141

[56] References Cited

U.S. PATENT DOCUMENTS

| 3,419,904 | 12/1968 | Weaver et al. | 361/141 |
| 3,577,067 | 5/1971 | Weaver | 324/320 |
| 4,284,950 | 8/1981 | Burl et al. | 324/320 |
| 4,320,342 | 3/1982 | Heinzerling | 324/320 X |

Primary Examiner—George Harris
Attorney, Agent, or Firm—Lawrence D. Cutter; James C. Davis, Jr.; Marvin Snyder

[57] ABSTRACT

A method for operating magnet correction coils is provided through the control of correction coil currents. The currents are determined from field measurements through the use of an iterative weighting algorithm. The algorithm is iterative and adjusts the weights at each iteration so as to reduce the range of variation.

8 Claims, 3 Drawing Figures

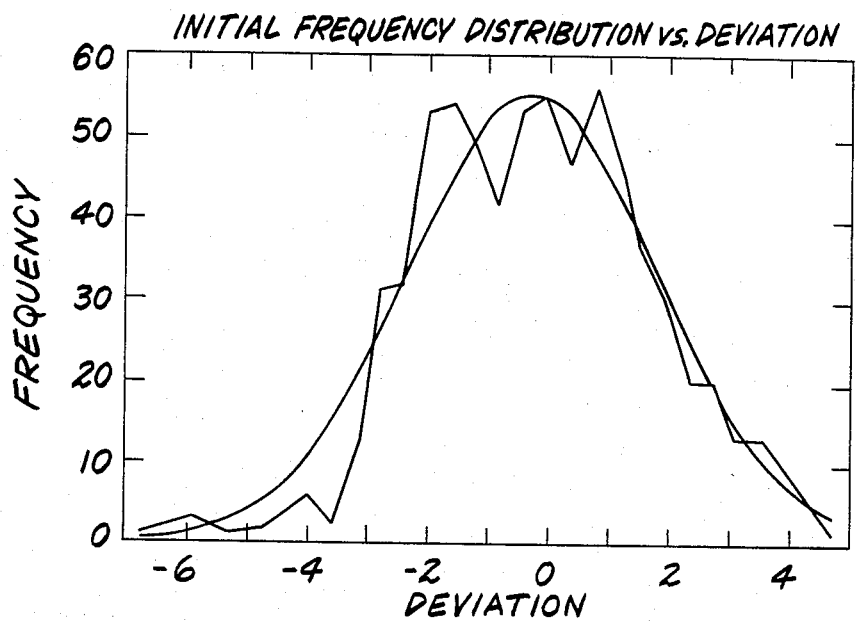
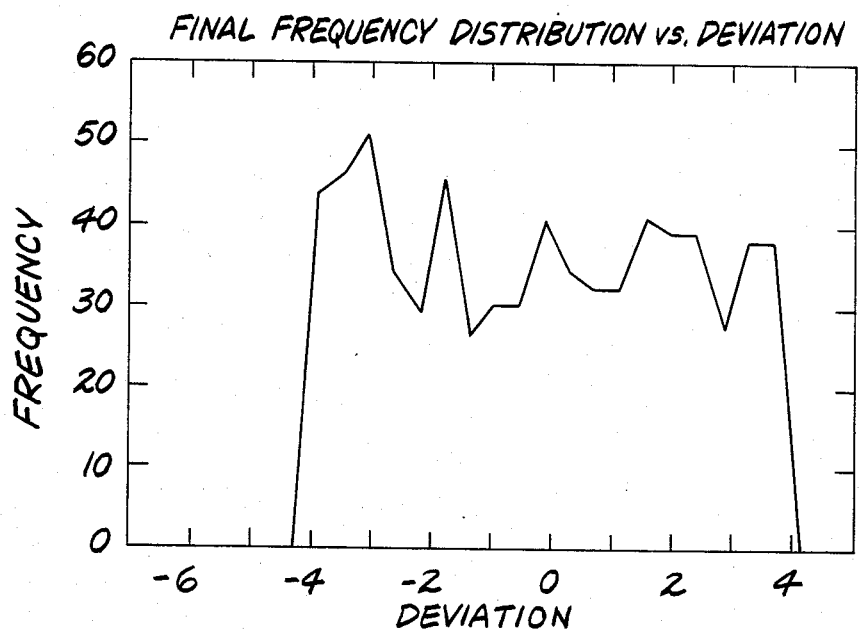

OPTIMAL FIELD INHOMOGENEITY CORRECTION COIL OPERATION FOR NMR MAGNETS

BACKGROUND OF THE INVENTION

The present invention relates to correction coils and methods of operating corrections coils, particularly those employed in conjunction with superconductive NMR magnets for medical diagnostic imaging.

One of the stringent requirements for nuclear magnetic resonance (NMR) diagnostic medical imaging is for the establishment of a highly uniform magnetic field. This magnetic field may be provided by permanent magnets, resistive magnets, or superconductive magnets. The latter are particularly advantageous in that high strength fields may be created and maintained without large energy input requirements. However, in all of these NMR magnet structures, the intrinsic magnetic fields are generally not sufficiently homogenous to perform the desired imaging or spectroscopy measurements to desirable resolutions for medical imaging. To correct the magnetic field so as to improve its uniformity, several types of correction coils are employed and these are driven by a variety of current settings. In NMR imaging systems, cylindrical magnets are generally employed in order to provide a central bore into which the patient may be placed. Accordingly, it is often convenient to employ a cylindrical coordinate system for analysis, as is done herein. These systems generally employ a main magnet together with a number of correction coils. These correction coils include both axisymmetric coils and transverse correction coils. The axisymmetric coils are generally disposed in a helical pattern on a cylindrical coil form while the transverse correction coils are generally disposed in a so-called saddle shape disposed on a cylindrical surface. The present invention is directed to providing currents to the various correction coils.

An efficient means for correction current selection involves producing a magnetic field map for the volume of interest. In this volume, deviations from the mean are reduced by adding the magnetic field contributions of several correction coils as predicted by the well known method of least-squares polynomial approximation over a set of points. The problem, however, is that this method results in a Gaussian distribution over the set of points and this distribution is wasteful of the NMR magnet hardware in that a few extreme points on the tails of the Gaussian distribution broaden the error distribution by large amounts.

At the present time, NMR magnets are typically corrected by regression methods which employ an iterative process of measuring a field map and optimizing one correction coil contribution and then iteratively following through with measurement and correction cycles for the rest of the correction coils. This process requires a minimum number of measurement and correction cycles which is dictated by the number of orthogonal correction coil sets. However, this process could require several such passes through the correction coil set since this set cannot in general be guaranteed to be totally or perfectly orthogonal.

Alternatively and complementarily, Monte-Carlo methods have been employed. In this method correction coil currents are set randomly, one at a time, and the effects are observed. Then the measurement and correction and cycle is repeated. However, this process of determining correction coil currents is much more time consuming than necessary.

BRIEF DESCRIPTION OF THE INVENTION

In accordance with a preferred embodiment of the present invention, a method for operating correction coils to achieve magnetic field uniformity comprises several steps. In the first step, the magnetic field within volume of interest is determined with no currents in the correction coils. In the second step, preliminary estimates for correction coil currents are determined and are dependent upon a weighting factor assigned to each measurement point. In the third step, new weighting factors are determined based in part on the range of error measurements. Steps 2 and 3 are then repeated each time with a different set of weighting values and each time the current estimates are determined from least squares minimization. The process is repeated until a satisfactory distribution is reached or until no further improvement in minimizing the maximum error is achieved. The resulting currents are then applied to their corresponding correction coils. While the calculations are preferably carried in a cylindrical coordinate system, any coordinate system may be employed.

Accordingly, it is an object of the present invention to provide a method for operating correction coils, particularly those for use in magnets employed in NMR imaging applications.

It is also an object of the present invention to reduce the inhomogeneities in a magnetic field, particularly one employed in NMR imaging.

It is yet another object of the present invention to provide a method for determining correction coil currents without the necessity of a plurality of measurement and current application iterations.

Lastly, but not limited hereto, it is an object of the present invention to provide a method for determining currents to be used in correction coils so as to achieve maximum magnetic field uniformity, particularly by minimizing the maximum deviation present in a given volume.

DESCRIPTION OF THE FIGURES

The subject matter which is regarded as the invention is particulary pointed out and distinctly claimed in the concluding portion of the specification. The invention, however, both as to organization and method or practice, together with further objects and advantages thereof, may best be understood by reference to the following description taken in connection with the accompanying drawings in which:

FIG. 1 is a plot of initial distribution frequency as a function of deviation;

FIG. 2 is a plot of final distribution frequency versus deviation;

DETAILED DESCRIPTION OF THE INVENTION

Figure 3:
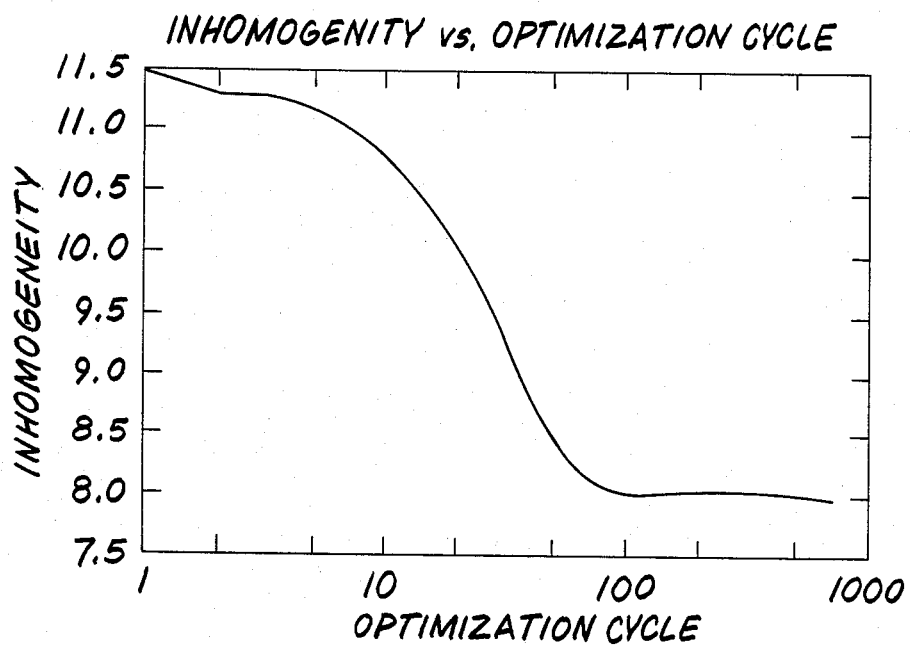
FIG. 3 is a plot of inhomogeneity as a function of iteration cycle.

In the present invention measurements are taken on the magnetic field within the volume for which uniformity is desired. Throughout the present specification, the field strength at point $p_i$ is denoted by $F(p_i)$. The field is measured at a plurality N of points. Typically, N is between 500 and 800 for the examples considered herein. The magnet system discussed herein typically possess a number of correction coils. S is employed herein to represent the number of correction coils employed. The object of the present invention is to determined current values $I_1, I_2, \ldots, I_S$ so as to minimize the value $X^2$, as defined below.

Each correction coil is designed and positioned to produce at each point $p_i$ its own contribution to $P_n(p_i)$ where n runs from 1 to S. For example, in cylindrical coordinates, a typical contribution at $p_i=(r_i, \phi_i, z_i)$, the field contribution is given by:

$$P_n(r_i, \phi_i, z_i) = \sum_{l=0}^{M} \sum_{m=-l}^{l} A_{lm}^n \left(\frac{r_i}{R_0}\right)^l Y_{lm}(\theta_i, \phi_i)$$

where $R_O$ is the radial dimension of the measurement volume; $\cos \theta_i = z_i/r_i$; $Y_{lm}(\theta_i, \phi_i)$ are the well-known spherical harmonic functions; M is chosen sufficiently large (about three to five times the square root of S) to give an accurate description of the individual field contributions due to coil number n; and where $A_{lm}^n$ are the strength coefficients for coil number n.

Accordingly, the total correction contribution for all of the correction coils is provided by:

$$P(p_i) = \sum_{n=1}^{S} I_n P_n(p_i).$$

Therefore, at each point a total deviation contribution $X_i$ for that point is defined as:

$$X_i = [F(p_i) - P(p_i)]/\delta_i,$$

where $\delta_i$ is a weight which is assigned to each measurement point. Initially, without more information, $\delta_i$ may be selected as being uniform or constant over all of the measurement points. It is a particular object of the present invention to vary $\delta_i$ for each point so as to achieve a better frequency distribution of deviation errors. A least squares problem is posed by seeking to minimize:

$$\chi^2 = \sum_{x=1}^{N} X_i^2 = \sum_{x=1}^{N} [(F(p_i) - P(p_i))/\delta_i]^2.$$

The value of $X^2$ is minimized by applying least squares approximation methods to the above formula for $X^2$ so as to determine preliminary estimates for the correction coil currents $I_n$. It is to be recalled in the above formula for $X^2$ that the currents $I_n$ occur in the formula for $P(p_i)$. It is also to be borne in mind that $I_n$ is a coefficient multiple of $P_n(p_i)$ which expresses the field contribution for the $n^{th}$ correction coil at point $p_i$ with one unit of current flowing in the correction coil.

A major aspect of the present invention is associated with determining a new set of weights $\delta_i$ for each measurement point. In particular, a new set of weights for the measurements points is particularly determined so as to modify the deviation frequency distribution for the N measurement points. In particular, in the present invention, a new set of weights $\delta_i$ is determined according to:

$$\delta_i^{(new)} = \delta_i^{(old)}[1 + a|X_i|/R]^{-1},$$

where $R = \max(X_1, X_2, \ldots, X_N) - \min(X_1, X_2, \ldots, X_N)$ and a is a positive convergence constant less than 1. Typically, a is approximatey 0.1. In this way, new weights are attached to each measurement point and a least squares determination is made again resulting in new values of currents $I_1, I_2, \ldots, I_S$.

The above described steps may be repeated as often as desired. In particular, current estimates for $I_n$ are calculated from the formula for $X^2$ using current values of $\delta_i$ after which new values of $\delta_i$ are determined based upon individual values of $X_i$ and the range R. The steps are thereafter repeated using new values for $\delta_i$. Of course, new values of $X_i$ result at each iteration. The process is continued until the frequency distribution of $X_i$ values is satisfactory or until the rate of decrease of the maximum $X_i$ value with each iteration it is such as to indicate that further improvement is not likely. For example, termination may be imposed when there is no further decrease in the maximum range of $X_i$.

The advantages which are achievable with the operation method of the present invention are illustrated for a particular example in FIGS. 1-3. With respect to FIG. 1, there are two curves shown. The smooth curve is a standard Gaussian curve normalized to conform to the mean and standard deviation of the data presented. The jagged curve shown in FIG. 1 depicts the deviation frequency distribution for a set of field measurements. Not only is the Gaussian distribution a good fit for this curve, it also indicates that the jagged curve inherently possesses points of deviation which lie on the tails of the Gaussian distribution. Such deviations are undesirable, particularly since it is one of the objects of the present invention to minimize the maximum error distribution. A more desirable distribution is that shown in FIG. 2 which is obtained by repeated application of the computational method presented herein. FIGS. 1 and 2 are normalized with respect to the standard deviation. FIG. 3 illustrates a plot of maximum inhomogeneity as a function of the iteration number. As can be seen, the inhomogeneity falls off relatively rapidly for up to about 100 iterations. Thereafter, improvement occurs more slowly.

While the iterative process may be continued for as long as is desirable, it is generally practical to consider ceasing the iterative steps when the improvement in maximum error amplitude decreases. It is also possible with the present method to measure the field value with currents in place in order to perform the necessary computational steps so as to generate correction values for the coil currents. However, the present method has the advantage that only one set of computations need to be computed although more can be if desired. Once desirable values for the currents, $I_n$, are determined, these currents are applied to their respective correction coils.

From the above, it should be appreciated that the present invention provides and accurate and precise way of operating correction current coils so as to minimize the maximum error occurrence. This is greatly advantageous in constructing magnets having highly uniform magnetic fields, these being particularly advantageous in nuclear magnetic resonance imaging. It is also seen that the method of the present invention can be approximately 30 percent better than the standard least square polynomial approximation method with respect to maximum error.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for operating correction coils to achieve a uniform magnetic field comprising the following steps:
   (a) measuring the magnetic field, with no current in the correction coils, at a plurality N of points within the volume for which uniformity is desired, the value of the field at the $i^{th}$ measurement point $p_i$ being denoted by $F(p_i)$;
   (b) determining a preliminary estimate for correction coil current $I_1, I_2, \ldots, I_S$ for S correction coils by a least squares minimization of $$\chi^2 = \sum_{n=1}^{N} \chi_i^2 = \sum_{n=1}^{N} [(F(p_i) - P(p_i))/\delta_i]^2,$$

where $$P(p_i) = \sum_{n=1}^{S} I_n P_n(p_i).$$

and where $P_n(p_i)$ is a polynomial function expressing the field contribution of correction coil n at point $p_i$ with one unit of current in correction coil n, and where $\delta_i$ is a non-zero weight assigned to each point $p_i$;
   (c) determining a new set of weights $\delta_i^{(new)}$ for each measurement point according to:

$$\delta_i^{(new)} = \delta_i^{(old)}[1 + a|X_i|/R]^{-1},$$

where $R = \max(X_1, X_2, \ldots, X_N) - \min(X_1, X_2, \ldots, X_N)$ and where a is a positive convergence constant less than 1;
   (d) repeating steps (b) and (c) at least once with $\delta_i$ in step (b) replaced by $\delta_i^{(new)}$ from step (a), so as to determine new values for correction current $I_1, I_2, \ldots, I_S$; and
   (e) applying said new values of currents $I_1, I_2, \ldots, I_S$ to correction coils 1 through S, respectively.

2. The method of claim 1 in which a is approximately 0.1.

3. The method of claim 1 in which $p_i$ is expressed in cylindrical coordinates $r_i$, $\phi_i$ and $z_i$.

4. The method of claim 3 in which $$P_n(r_i, \phi_i, z_i) = \sum_{l=0}^{M} \sum_{m=-l}^{l} A_{lm}^n \left(\frac{r_i}{R_0}\right)^l Y_{lm}(\theta_i, \phi_i)$$

where $R_0$ is the radial dimension of the measurement volume; $\cos \theta_i = z_i/r_i$; $Y_{lm}(\theta_i, \phi_i)$ are the well-known spherical harmonic functions; M is a positive integer; and where $A_{lm}^n$ are the strength coefficients for coil number n.

5. The method of claim 1 in which said weights, $\delta_i$, are initially set equal to 1.

6. The method of claim 1 in which N is between about 500 and 800.

7. The method of claim 1 in which said corrections coils are superconductive.

8. The method of claim 1 in which steps (b) and (c) are repeated until no reduction in $[\max(X_1, X_2, \ldots, X_N) - \min(X_1, X_2, \ldots, X_N)]$ occurs.

* * * * *